US009846644B2

(12) United States Patent
Perner (10) Patent No.: US 9,846,644 B2
(45) Date of Patent: Dec. 19, 2017

(54) NONVOLATILE MEMORY ARRAY LOGIC (71) Applicant: Hewlett-Packard Development Company, L.P., Houston, TX (US)

(72) Inventor: Frederick Perner, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 211 days.

(21) Appl. No.: 14/759,713

(22) PCT Filed: Jan. 14, 2013

(86) PCT No.: PCT/US2013/021456
§ 371 (c)(1),
(2) Date: Jul. 8, 2015

(87) PCT Pub. No.: WO2014/109771
PCT Pub. Date: Jul. 17, 2014

(65) Prior Publication Data
US 2015/0356006 A1 Dec. 10, 2015

(51) Int. Cl.
*G06F 12/02* (2006.01)
*G11C 7/10* (2006.01)
(Continued)

(52) U.S. Cl.
CPC ........ *G06F 12/0246* (2013.01); *G11C 7/1006* (2013.01); *G11C 13/0002* (2013.01);
(Continued)

(58) Field of Classification Search
None
See application file for complete search history.

(56) References Cited

U.S. PATENT DOCUMENTS 7,023,040 B2 4/2006 Forbes et al.
7,683,662 B2 3/2010 Bianchi et al.
(Continued)

FOREIGN PATENT DOCUMENTS

CN 101256830 9/2008
CN 102016811 4/2011
(Continued)

OTHER PUBLICATIONS

Xu, Cong, et al. "Design implications of memristor-based RRAM cross-point structures." Design, Automation & Test in Europe Conference & Exhibition (DATE), 2011. IEEE, 2011.*
(Continued)

*Primary Examiner* — Charles Rones
*Assistant Examiner* — Hewy Li
(74) *Attorney, Agent, or Firm* — Fabian VanCott (57) ABSTRACT A method for implementing nonvolatile memory array logic includes configuring a crosspoint memory array in a first configuration and applying an input voltage to the crosspoint array in the first configuration to produce a setup voltage. The crosspoint array is configured in a second configuration and an input voltage is applied to the crosspoint array in the second configuration to produce a sense voltage. The setup voltage and the sense voltage compared to perform a logical operation on data stored in the crosspoint array. A system for performing nonvolatile memory array logic is also provided.

20 Claims, 6 Drawing Sheets

| Logic Function | Set Up Row Sel | Sense Row Sel | Output Comparator | Preset Reset | Q Data Out |
|---|---|---|---|---|---|
| nAND | ref_1 | all - 1 | no delta | 1 | 1 |
| | | 1 of n = 0 | neg pulse | | 0 |
| nNAND | ref_1 | all - 1 | no delta | 0 | 0 |
| | | 1 of n = 0 | neg pulse | | 1 |
| nOR | ref 0 | all - 0 | no delta | 0 | 0 |
| | | 1 of n = 1 | pos pulse | | 1 |
| nNOR | ref 0 | all - 0 | no delta | 1 | 1 |
| | | 1 of n = 1 | pos pulse | | 0 |
| XOR | row a | b=a | no delta | 0 | 0 |
| | a=1 | b=0 | neg pulse | | 1 |
| | a=0 | b=1 | pos pulse | | 1 |
| XNOR | row a | b=a | no delta | 1 | 1 |
| | a=1 | b=0 | neg pulse | | 0 |
| | a=0 | b=1 | pos pulse | | 0 |

(51) Int. Cl.
G11C 13/00 (2006.01)
G11C 27/02 (2006.01)
H03K 19/177 (2006.01)

(52) U.S. Cl.
CPC ........ *G11C 13/0004* (2013.01); *G11C 13/004* (2013.01); *G11C 13/0007* (2013.01); *G11C 13/0011* (2013.01); *G11C 27/026* (2013.01); *H03K 19/1776* (2013.01); *G06F 2212/7201* (2013.01); *G11C 2013/0054* (2013.01); *G11C 2013/0057* (2013.01); *G11C 2213/77* (2013.01)

(56) References Cited

U.S. PATENT DOCUMENTS

| | | |
|---|---|---|
| 2008/0205119 A1 | 8/2008 | Nagai et al. |
| 2008/0212387 A1 | 9/2008 | Hoefler |
| 2009/0122611 A1 | 5/2009 | Shimizu et al. |
| 2009/0273968 A1 | 11/2009 | Lamorey et al. |
| 2011/0127487 A1 | 6/2011 | Wirtz et al. |
| 2012/0134226 A1 | 5/2012 | Chow |
| 2012/0170353 A1 | 7/2012 | Iijima et al. |
| 2012/0243291 A1 | 9/2012 | Gopalakrishnan |
| 2013/0010521 A1 | 1/2013 | Carter |

FOREIGN PATENT DOCUMENTS

| | | |
|---|---|---|
| CN | 102138180 | 7/2011 |
| WO | WO-2012067667 A1 | 5/2012 |
| WO | WO-2012087667 A1 | 5/2012 |

OTHER PUBLICATIONS

Jung, Chul-Moon, Jun-Myung Choi, and Kyeong-Sik Min. "Two-step write scheme for reducing sneak-path leakage in complementary memristor array." IEEE Transactions on Nanotechnology 11.3 (2012): 611-618.*

Extended European Search Report dated Dec. 7, 2016 for EP Application No. 13871190.8; pp. 15.

Fabien Alibart et al, "Hybrid CMOS/Nanodevice Circuits for High Throughput Pattern Matching Applications", 2011 NASA/ESA Conference on Adaptive Hardware and Systems; pp. 279-286.

G. Snider, "Computing with hysteretic resistor crossbars", Applied Physics A Materials Science & Processing; Appl. Phys. A 80, 1165-1172 (2005).

Jakob Mustafa et al, "A Novel Reference Scheme for Reading Passive Resistive Crossbar Memories", IEEE Transactions on Nanotecnnology, vol. 5, No. 6, Nov. 2006; pp. 687-691.

Garcia, C., Design of Boolean Functions and Memory Units Based on Resistive Switching Devices (Research Paper), Oct. 2010, 6 Pages.

International Search Report & Written Opinion, dated Oct. 22, 2013, PCT Patent Application No. PCT/US2013/021456, 9 pages.

Shen, W.C. et al., Memristor Logic Operation Gate with Share Contact RRAM Cell, (Research Paper), Dec. 2011, vol. 32, No. 12, 3 Pages.

* cited by examiner

| Type | Symbol | Boolean Algebra | Truth Table | | |
|------|--------|-----------------|---|---|---|
| AND |  | $A \cdot B$ | Input | | Output |
| | | | A | B | A AND B |
| | | | 0 | 0 | 0 |
| | | | 0 | 1 | 0 |
| | | | 1 | 0 | 0 |
| | | | 1 | 1 | 1 |
| OR |  | $A + B$ | Input | | Output |
| | | | A | B | A OR B |
| | | | 0 | 0 | 0 |
| | | | 0 | 1 | 1 |
| | | | 1 | 0 | 1 |
| | | | 1 | 1 | 1 |
| NAND |  | $\overline{A \cdot B}$ | Input | | Output |
| | | | A | B | A NAND B |
| | | | 0 | 0 | 1 |
| | | | 0 | 1 | 1 |
| | | | 1 | 0 | 1 |
| | | | 1 | 1 | 0 |

*Fig. 3A*
*(Prior Art)*

| Type | Symbol | Boolean Algebra | Truth Table | | |
|---|---|---|---|---|---|
| NOR |  | $\overline{A+B}$ | Input | | Output |
| | | | A | B | A NOR B |
| | | | 0 | 0 | 1 |
| | | | 0 | 1 | 0 |
| | | | 1 | 0 | 0 |
| | | | 1 | 1 | 0 |
| XOR |  | $A \oplus B$ | Input | | Output |
| | | | A | B | A XOR B |
| | | | 0 | 0 | 0 |
| | | | 0 | 1 | 1 |
| | | | 1 | 0 | 1 |
| | | | 1 | 1 | 0 |
| XNOR |  | $\overline{A \oplus B}$ $A \odot B$ | Input | | Output |
| | | | A | B | A XNOR B |
| | | | 0 | 0 | 1 |
| | | | 0 | 1 | 0 |
| | | | 1 | 0 | 0 |
| | | | 1 | 1 | 1 |

Fig. 3B
*(Prior Art)*

| Logic Function | Set Up Row Sel | Sense Row Sel | Output Comparator | Preset Reset | Q Data Out |
|---|---|---|---|---|---|
| nAND | ref_1 | all - 1 | no delta | 1 | 1 |
|  |  | 1 of n = 0 | neg pulse |  | 0 |
| nNAND | ref_1 | all - 1 | no delta | 0 | 0 |
|  |  | 1 of n = 0 | neg pulse |  | 1 |
| nOR | ref 0 | all - 0 | no delta | 0 | 0 |
|  |  | 1 of n = 1 | pos pulse |  | 1 |
| nNOR | ref 0 | all - 0 | no delta | 1 | 1 |
|  |  | 1 of n = 1 | pos pulse |  | 0 |
| XOR | row a | b=a | no delta | 0 | 0 |
|  | a=1 | b=0 | neg pulse |  | 1 |
|  | a=0 | b=1 | pos pulse |  | 1 |
| XNOR | row a | b=a | no delta | 1 | 1 |
|  | a=1 | b=0 | neg pulse |  | 0 |
|  | a=0 | b=1 | pos pulse |  | 0 |

NONVOLATILE MEMORY ARRAY LOGIC

BACKGROUND

Nonvolatile memory arrays can be used to store digital data. Sense circuitry connected to the memory array detects the state of resistive devices within the memory array and sends these measurements to external circuitry for communication and processing. The processing of the digital data may include performing a number of logic operations.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Data can be stored in non-volatile memory for long term preservation. Typically, this data is transferred out of the non-volatile memory to a volatile memory for use. The data in the volatile memory can then be accessed and processed by a processor. The processor may perform a variety of operations on the data including Boolean logic operations. However, the transfer of data out of one memory and into another to make it available to a processor complicates the logical operation and takes additional time and energy.

The principles described herein are directed to systems and methods for performing basic Boolean operations on data without transferring the data values out of nonvolatile memory. In one example, a resistive non-volatile random access memory (NVRAM) array with dynamic sense amplifiers can be made to function as a variety of Boolean logic gates (nAND, nNAND, nOR, nNOR, XOR, and XNOR). To perform this operation, a logical operation period is divided into two sections (time periods): a setup period and a sense period. The NVRAM and the dynamic sense amplifier are configured during a setup period to implement the desired Boolean logic operation. For example, the setup may include selecting a predetermined row reference from the NVRAM array and setting an output latch preset/reset value to define the Boolean logic operation. After the setup period, the reference row is de-asserted and one or more rows containing the input data bits are selected (the "sense period") for the remainder of the logical operation period. The Boolean logic created during the "setup period" is applied to the input data during the sense period to produce a logical output value. The logical output value is held in a latch within the dynamic sense amplifier. Thus, the array with configurable logic may function as simultaneously as nonvolatile memory and an array logic gate.

This allows basic Boolean logic operations to be performed on data within the NVRAM array without reading/writing the data to a different memory. These logic operations allow for searching, comparing and analyzing the data. Because the data is not moved to off-array logic circuitry, the desired logical operation(s) can be performed very rapidly.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
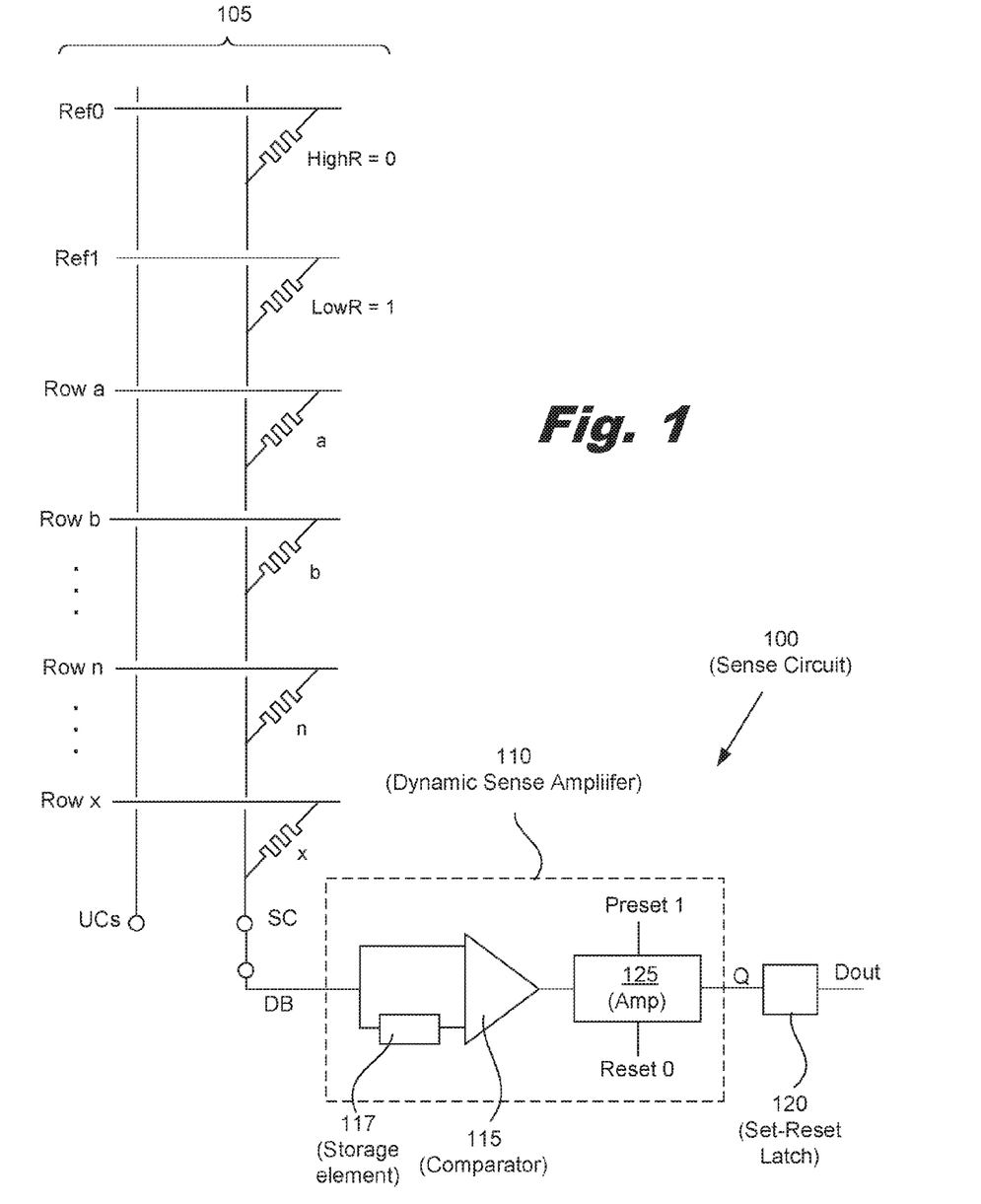
FIG. 1 is block diagram of a portion of a crosspoint array connected to a dynamic sense circuit, according to one example of principles described herein.

FIG. 1 is a block diagram of a portion of a resistive NVRAM crossbar array (105) connected to high speed dynamic sense circuit (100). The resistive crossbar array (105) has a number of horizontal row lines that cross over perpendicular column lines. However, the orientation angle between the row lines and column lines may vary. Each row line overlies all of the column lines and comes in close contact with each column line at the intersections. Resistive memory elements (e.g. HighR, LowR, a, b . . . n . . . x) form junctions between the row lines and column lines at each intersection. A data value can be stored in each memory element (crosspoint device) of the crossbar array using the high-resistance state of the memory element to represent a logic "0" bit value and the low-resistance state to represent a logic "1" bit value or vice versa, depending on the convention selected. The bit value stored at a crosspoint device can be "read" or "sensed" by determining the resistance state of the memristor. For example, the crosspoint devices may be memristors, resistive random access memory (ReRAM), conductive-bridging random access memory (CBRAM), phase change memory (PRAM, PCRAM), or other types of memory. For example, the crosspoint devices could be resistive memory based on perovskites (such as $Sr(Zr)TiO_3$ or PCMO), transition metal oxides (such as NiO or $TiO_2$,), chalcogenides (such as $Ge_2Sb_2Te_5$ or AgInSbTe), solid-state electrolyte materials (such as GeS, GeSe, or $Cu_2S$), organic charge transfer complexes (such as CuTCNQ), organic donor-acceptor systems (such as Al AlDCN), and various other material and molecular systems.

To address a particular crosspoint device, the appropriate row and column lines are selected. Ideally, only the crosspoint device at the intersection of the selected row line and selected column (SC) line would influence the measurement. However, there are a number of other factors, including leakage paths through other memristors that may obscure the resistance measurement. Although only six row lines and two column lines are illustrated, the array may include hundreds or thousands of row and column lines.

When a read or programming voltage is applied to a particular pair of row and column lines, a substantial portion of the applied current passes through the memristor at the intersection of the row line and column line. Any of the rows may be selected singly or in combination with any other rows. For example, rows a and b may be selected together.

The upper two rows (Ref0 and Ref1) are references rows. The programmable resistors in these rows are preprogrammed to have specific resistance values. For example, the first row, Ref0, may include memristive devices that have been programmed to a high resistance state and represent a digital "0". The second row, Ref1, may include memristive devices that have been programmed to a low resistance state and represent a digital "1".

In addition to the reference rows there are x data rows. These rows are labeled row a, row b . . . row n . . . and row x. The sequence of dots between rows b, n, and x indicate the inclusion of additional rows that are not illustrated. For example, x may be on the order of 10 to 1000. During logic operations, any combination of these x rows may be selected.

Columns are also selected. In this example, the databus ("DB") is connected to a selected column ("SC"). Unselected columns are indicated as "UCs." The crosspoint devices at the intersection of the rows and the selected column are shown and labeled as HighR, LowR, a, b, n, and x.

FIG. 1 also shows a dynamic sense circuit (100) that includes a dynamic sense amplifier (110) and a set-reset (SR) latch (120). The dynamic sense circuit is configured to make measurements of the states of the crosspoint devices within the memory array (105) and to implement various logic operations. The dynamic sense amplifier (110) includes a comparator (115) and a high speed amplifier (125). In general, the comparator (115) auto-zeros to reduce offset errors and stores a reference ("setup") voltage in a storage element (117). The storage element (117) may have a variety of configurations that allow it to store the reference voltage. For example, the storage element may include a capacitor to hold a charge that is proportional to the reference voltage and one or more resistors to control the RC time constant for the charging/discharging of the capacitor.

This reference voltage represents a known resistance reference memristor and other parasitic resistances within the array (105). The comparator (115) then compares the stored reference voltage to a sensed voltage. For example, the reference voltage may be held in a capacitor in the storage element (117). When the array configuration is switched to produce the sensed voltage, one input of the comparator (115) will be directly connected to the array (105) and a second input of the comparator (115) is directly connected to the capacitor in the storage element (117). Thus, for a brief period of time the comparator (115) receives both the setup voltage and the sense voltage for comparison. As the capacitor in the storage element (117) discharges, voltage applied to this input of the comparator (115) will gradually drop. However, the comparison of the voltages by the comparator (115) takes place relatively quickly compared to the RC time constant of the capacitor (115) in the storage element (117). Thus, the comparison between the setup voltage and sense voltage can be relatively accurate.

The output from the comparator (115) is received by the amplifier (125). In some examples, the amplifier (125) includes an AC coupling capacitor. The capacitor blocks direct current (DC) but allows alternating current (AC) to pass into the amplifier (125). The amplifier (125) includes three inputs: the input from the comparator (115), a preset 1 and a reset 0. The amplifier (125) amplifies the AC output from the comparator (110) and outputs the result (Q) to a set-reset (SR) latch (120). The SR latch (120) is used as a sample-and-hold analog-to-digital converter. If the input (Q) to the SR latch (120) is above a predetermined threshold, the SR latch (120) outputs a high digital signal on the output line Dout. If the input of the SR latch (120) is below a threshold, the SR latch (120) outputs a low digital signal on the output line Dout. A memory controller receives the digital signal from the SR latch (120) for processing and communication. There may be a number of additional components and variables that influence the measurement and operation of the system shown in FIG. 1.

Figure 2A:
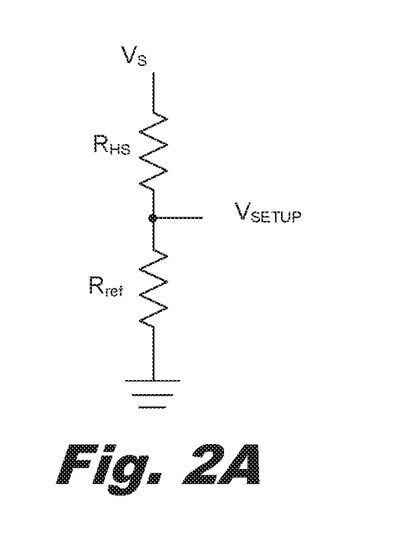
FIGS. 2A and 2B are electrical schematic models of two different configurations of a nonvolatile memory array, according to one example of principles described herein.

FIG. 2A is a schematic diagram that describes a setup configuration of the cross point array. In this configuration, a column SC (FIG. 1) has been selected and connected to the dynamic sense circuit (100, FIG. 1). A reference row (Ref0 or Ref1) has also been selected. A sense voltage (Vs) is applied to the unselected rows and the selected row is connected to the ground potential. This creates the voltage divider shown in FIG. 2A, where the impedance of the half selected crosspoint devices is represented as $R_{HS}$ and the impedance of the selected crosspoint devices is shown as $R_{ref}$. In general the term "half selected" refers to crosspoint devices that are connected to one of the selected rows lines or selected column lines but not to both the selected row and column lines. The term "selected" crosspoint device refers to devices that are connected to both a selected row and a selected column. Where only one row and one column are selected, there is only one selected crosspoint device. This selected crosspoint device is interposed between a selected row and a selected column at their intersection. For example, referring to FIG. 1, if the column SC and the row Ref0 are selected, then the selected crosspoint devices is HighR and the half selected crosspoint devices are all the crosspoint devices that are connected to the selected column SC and all the non selected rows, including crosspoint devices a through x and LowR. Multiple rows and multiple columns may be simultaneously selected, producing a value for $R_{ref}$ that is a combination of all selected crosspoint devices.

The value of $R_{HS}$ is dependent on the data values stored in the half selected devices. Thus, $R_{HS}$ is not a fixed value. $V_{SETUP}$ will be a fraction of the sense voltage that is dependent on the ratio between $R_{HS}$ and $R_{ref}$.

Figure 2B:
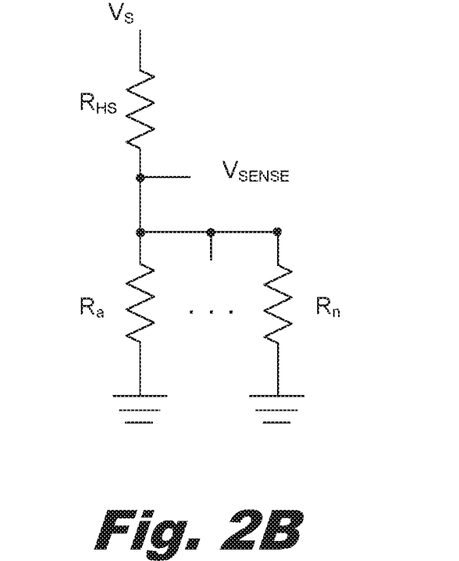

FIG. 2B is a schematic diagram that describes a second configuration of a cross point array. In this configuration, the same column SC is selected but multiple data rows a through n are selected. The output of the voltage divider is $V_{SENSE}$, which is received by the comparator (115, FIG. 1) of the dynamic sense amplifier (125, FIG. 1). The dynamic sense amplifier (125, FIG. 1) compares $V_{SETUP}$ to $V_{SENSE}$. The relationship between the crosspoint resistances, comparator, and amplifier are summarized in Table 1 below. $R_{par}$ is the equivalent resistance of $R_a, R_b, \ldots R_n$ connected in parallel.

TABLE 1

| Crosspoint Resistances | Comparator Operation | Comparator Output | Amplifier Output | Data Latch Output |
|---|---|---|---|---|
| Rref = Rpar | Vsetup = Vsense | No change | Output preset/ reset value | If no output pulse, hold |
| Rref > Rpar | Vsetup > Vsense | Positive pulse | If Preset 1 then no output pulse | digital 1 or 0 per preset/reset |

TABLE 1-continued

| Crosspoint Resistances | Comparator Operation | Comparator Output | Amplifier Output | Data Latch Output |
|---|---|---|---|---|
| Rref < Rpar | Vsetup < Vsense | Negative pulse | If Reset 0, then positive pulse If Preset 1 then negative pulse, If Reset 0, then no output pulse | value If there is a positive pulse, then output a digital 1 If there is negative pulse, then output a digital 0. |

Figure 3A:
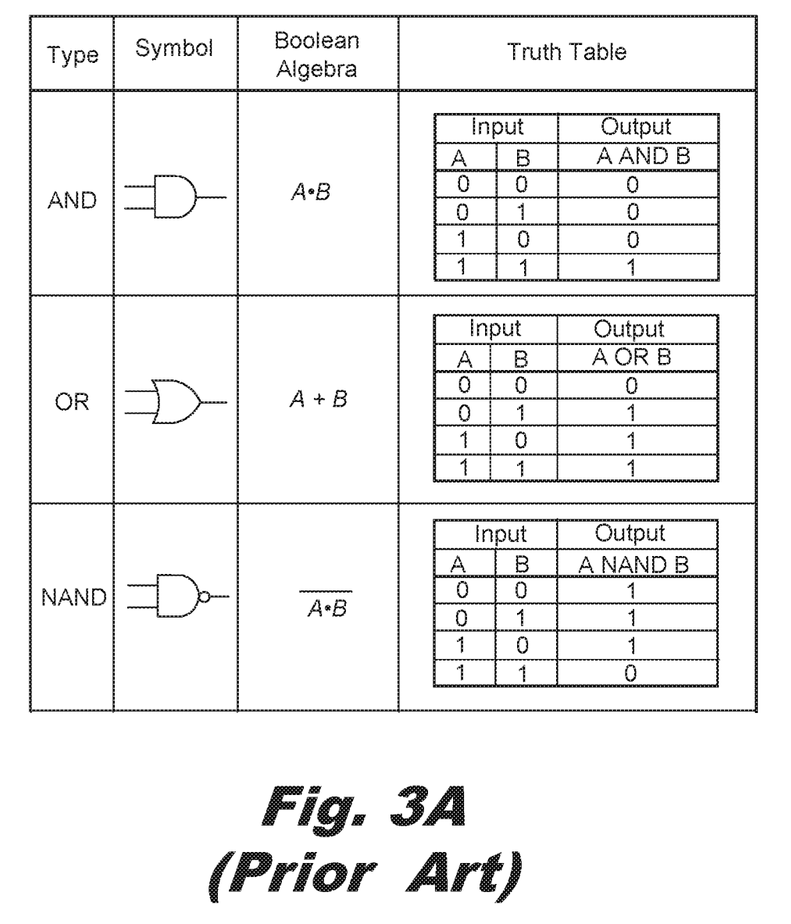
FIGS. 3A and 3B provide a chart showing various logic types and their corresponding truth tables, according to one example of principles described herein.
Figure 3B:
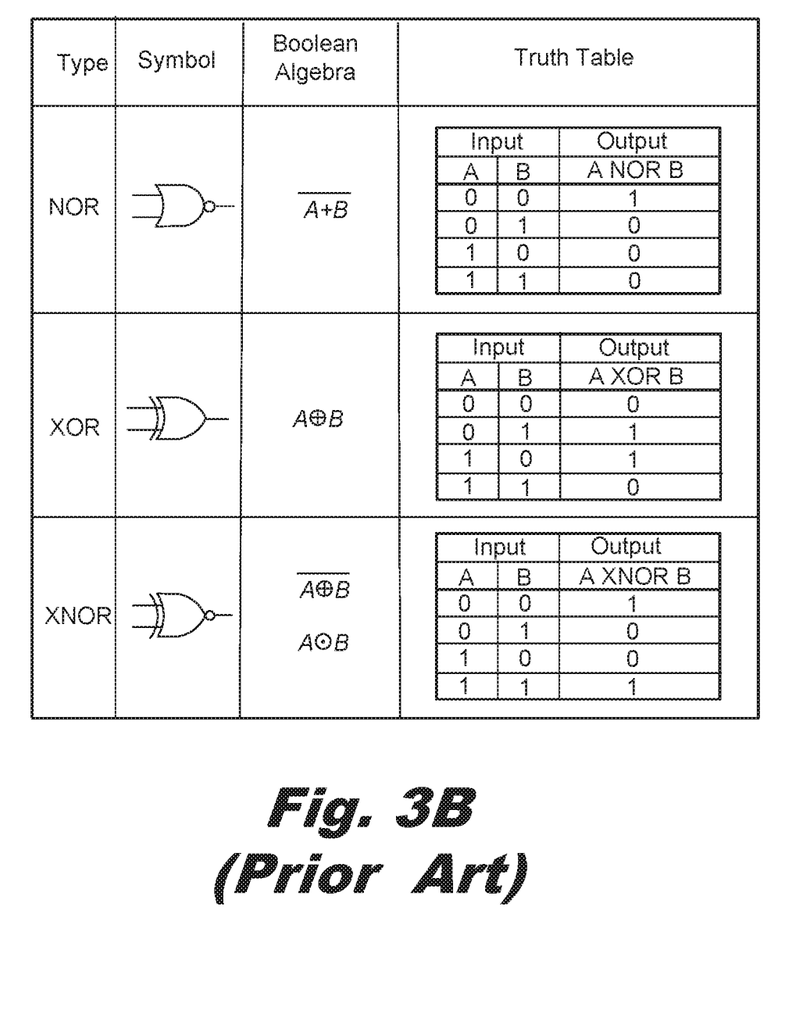

The table in FIGS. 3A and 3B shows various examples of Boolean logic operations that can be performed on data values logic array using the system described above. The first column of the table lists the Boolean operation: AND, OR, NAND, NOR, XOR, and XNOR. The second column shows the symbol for the logical operation and the third column shows a Boolean algebra expression for the logical operation. The last column shows a truth table for the Boolean logic operations. In this example, the input is a data value A and B and output depends on the logical operation as applied to the data values A and B. For example, the data value A may represent the programmed resistance of the crosspoint device a and the data value B may represent the programmed resistance of the crosspoint device b as shown in FIG. 1. A crosspoint device with a high resistance may represent a digital 0 while a crosspoint device with a low resistance represents a digital 1.

For the logical AND operation, both A and B must be 1 to generate an output of 1. Otherwise, the output is 0. For example, if A=0 and B=0, the output of the logical AND operation is 0. If A=0 and B=1, the output of the logical AND operation is 0. If A=1 and B=0, the output of the logical AND operation is 0. However if A=1 and B=1, the output of the logical AND operation is 1. The truth tables provide corresponding descriptions of the other logical operations.

Figure 4A:
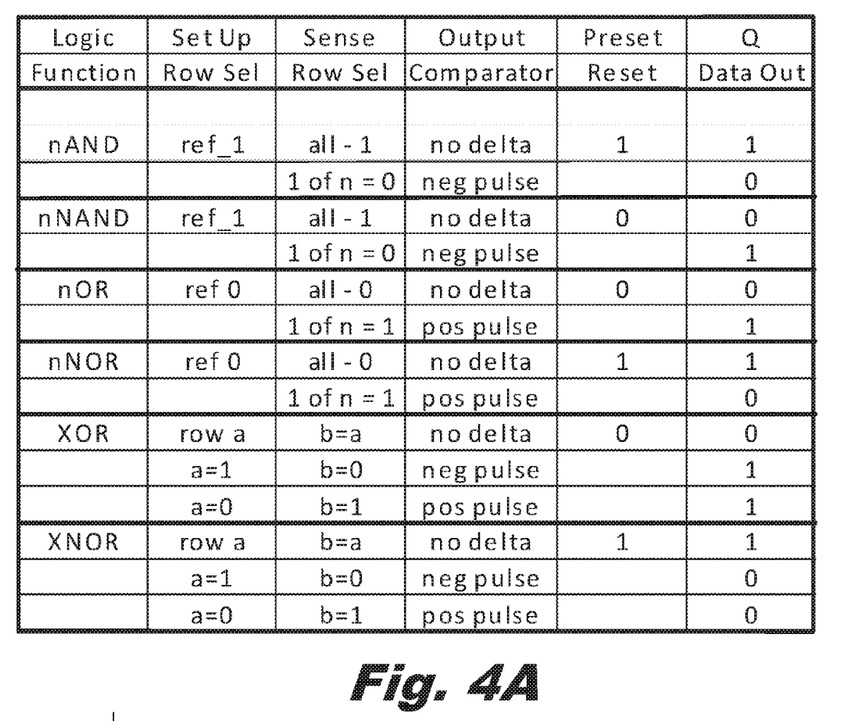
FIG. 4A is a chart showing the operation of a nonvolatile memory array and attached dynamic sense circuit to produce a variety of logic operations, according to one example of principles described herein.

The table in FIG. 4A shows the configuration parameters for the crosspoint array and dynamic sense amplifier to implement the various logical operations. The columns of FIG. 4A show the logic function, the setup row selection, the sense row selection, the output of the comparator, the preset/reset value, and the digital output to the data latch.

The first logic function is a nAND function. The nAND function indicates that there may be n inputs that are compared. For example, there may be n rows in the crosspoint array that are simultaneously selected as inputs for the AND operator. To set up this operation, the reference row Ref1 is selected. As discussed above, Ref1 has a low resistance that represents a logical value of 1. As shown in FIG. 2A, the setup voltage $V_{SETUP}$ is output to the dynamic sense circuit and stored in a storage element (117, FIG. 1). The configuration of the crosspoint array (105, FIG. 1) is then changed to select the desired n rows that contain data to be operated on. For example, n may be two and rows a and b may be selected. However, any combination of the x rows of data may be selected. If all of the selected crosspoint devices have low resistances (digital values of 1) then the comparator (115, FIG. 1) does not output a signal. However, if any of the n crosspoint devices is in a high resistance state (a digital value of 0) then the output comparator produces a negative pulse. The preset/reset value of the amplifier is set at 1. If no negative pulse is received by the amplifier (125, FIG. 1), the amplifier outputs the preset value of 1 (Q=1). If a negative pulse is received, the amplifier outputs a value of 0 (Q=0). This implements the logical AND operation for all selected crosspoint devices.

The remaining logic functions are similarly implemented. To setup the desired logical operation, the reference row is selected and the preset/reset value in the amplifier is selected. The use of a setup configuration with a selected reference row serves at least two functions. First, the setup configuration allows for the influence of the half selected devices to be reduced or eliminated. The logical operations are performed on the selected devices, not the half selected devices. The resistance of the half selected devices represents undesirable noise. The setup voltage provides a baseline measurement of the half selected resistances ($R_{HS}$) to provide negation of any influence of the half selected devices when the subsequent sense measurement is made. This allows the variable resistance represented by the half selected devices to be calibrated out of the logical operation. As discussed above, the resistance of the half selected devices is not known a priori and changes as the half selected devices are reprogrammed with new data values. However, because the state of the half selected devices remains constant throughout the logical operation, they can be calibrated out by making a differential measurement that includes a setup measurement and a sense measurement.

The second function of the setup configuration is to generate a setup voltage that captures a state (a digital 1 or 0) that the later measured states of crosspoint devices containing data can be compared to. In the nAND operation that is shown in FIG. 4A, the reference value is a digital 1.

The use of a preset/reset input as shown in column 5 is used to reverse the polarity of the logic operation. For example, a nAND operation can be converted into nNAND operation by changing the preset/reset input. Similarly, the nOR can be converted to a nNOR and the XOR can be converted to an XNOR operation.

Figure 4B:
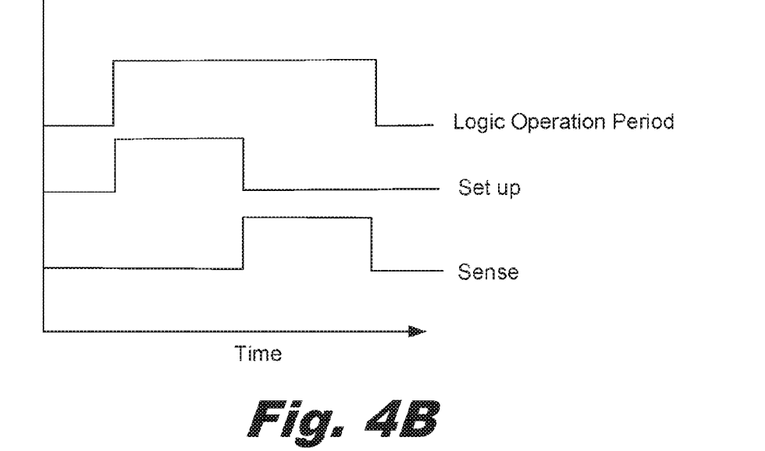
FIG. 4B is a timing chart for producing the logic operations described in FIG. 4A, according to one example of principles described herein.

FIG. 4B shows a timing diagram for the logical operation. A variety of operations may be performed on a crosspoint array. For example, there may be read, write and logical operations. The logical operation period includes two distinct sub-periods: a setup sub-period where the crosspoint array is in the setup configuration and generates $V_{SETUP}$ as shown in FIG. 2A; and a subsequent sense sub-period where the crosspoint array is in a sense configuration and generates $V_{SENSE}$ as shown in FIG. 2B.

Figure 5:
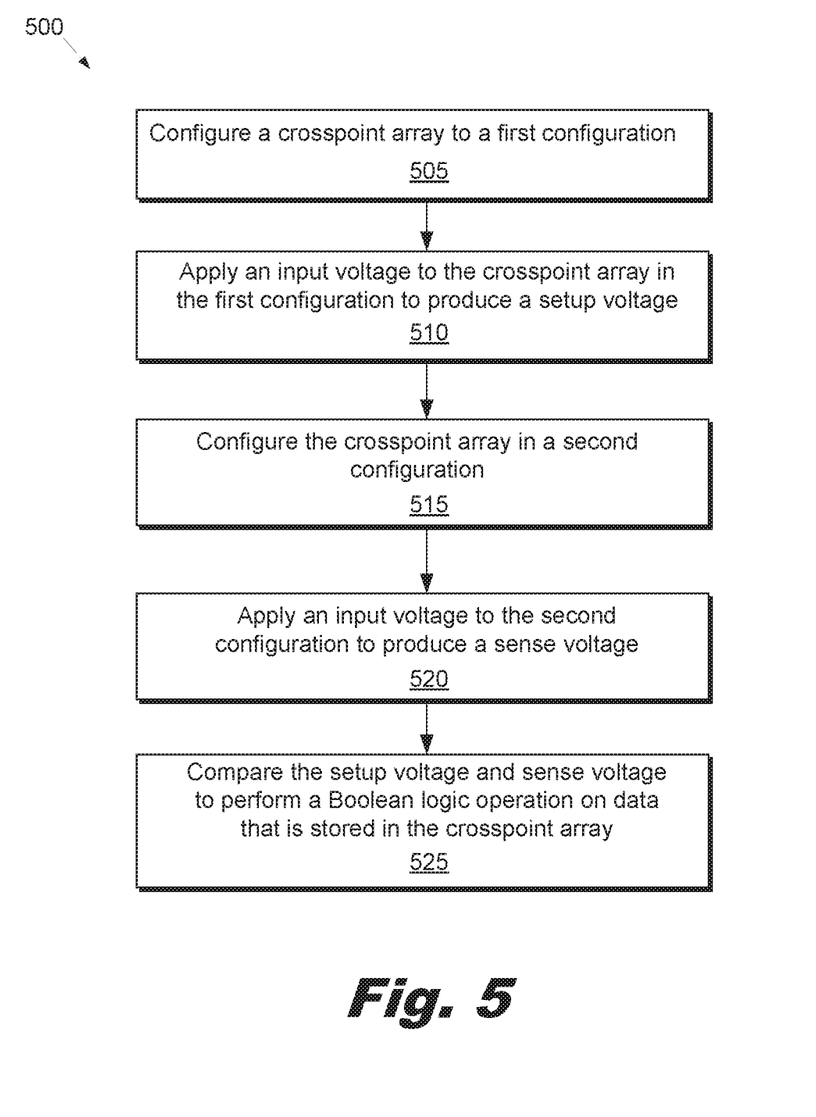
FIG. 5 is a flowchart showing an illustrative method for performing logic operations using a nonvolatile memory array, according to one example of principles described herein.

FIG. 5 is a flowchart (500) of an illustrative method for implementing logic operations in a nonvolatile memory array. The method includes configuring a crosspoint array in a first configuration (block 505) and applying an input voltage to the crosspoint array in the first configuration to produce a setup voltage (block 510). For example, the first configuration may include selection of a column and a reference row to create a voltage divider as shown in FIG.

2A. The setup voltage may be stored in a storage element of dynamic sense amplifier as shown in FIG. 1.

The crosspoint array is configured in a second configuration (block 515) and an input voltage is applied to the crosspoint array in the second configuration to produce a sense voltage (block 520). For example, the second configuration may include the selection of multiple data rows to create a voltage divider as shown in FIG. 2B. The setup voltage and sense voltage are compared to perform a Boolean logic operation on data that is stored in the crosspoint array (block 525). The input voltage applied to the first configuration and the input voltage applied to the second configuration may be the same or different.

FIG. 5 is only one example of a method for implementing logic operations in a nonvolatile memory array. The blocks described above could be rearranged, combined, deleted, or new blocks could be added. For example, where the negative versions of Boolean operations are desired, the output of the comparator may be sent to an amplifier that includes preset/reset values. A first preset/reset value can be set to provide for a positive Boolean operation (such as an AND or OR operation) while a second preset/reset value can be selected to provide a negative Boolean operation (such as NAND or NOR operation). Additionally, the output of the amplifier can be sent to a digital data latch that is accessible by an external memory or processor.

One implementation of a method for implementing logical operations in a resistive nonvolatile crosspoint memory array includes selecting the logical Boolean operation by selecting a reference row and a column in the crosspoint array and inputting preset/reset value to an amplifier in a sense circuit and then applying an input voltage to the reference row to produce a setup voltage. This setup voltage is stored in a storage element in the sense circuit. As part of the logical operation, crosspoint memory array is reconfigured. The reconfiguration of the crosspoint memory array includes selecting data rows intersecting the selected column in the crosspoint array, in which crosspoint devices at the intersection of the selected data rows and selected column store data values to be used in the Boolean logic operation. An input voltage is applied to the selected data rows to produce a sense voltage. The sense voltage is compared to the setup voltage with a comparator. The comparator outputs a voltage pulse from the comparator if the sense voltage is different than the setup voltage. The voltage pulse may be either positive or negative. The amplifier accepts the comparator output and produces a digital output. If no voltage pulse is produced by the comparator, then the digital output to the latch is the preset/reset value. If a voltage pulse is produced by the comparator, the amplifier modifies the preset/reset value and outputs the modified preset/reset value to the latch.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for implementing nonvolatile memory array logic comprising:
   configuring a crosspoint memory array in a first configuration;
   applying an input voltage to the crosspoint memory array in the first configuration to produce a setup voltage;
   configuring the crosspoint memory array in a second configuration;
   applying the input voltage to the crosspoint memory array in the second configuration to produce a sense voltage; and
   comparing the setup voltage and the sense voltage to perform a logical operation on data stored in the crosspoint memory array.

2. The method of claim 1, in which the logical operation is a logical operation performed on data stored in the crosspoint memory array without transferring the data to a separate memory.

3. The method of claim 1, in which the logic operation is a Boolean logic operation.

4. The method of claim 1, in which the first configuration and second configuration determine a type of the logical operation performed.

5. The method of claim 1, in which configuring a crosspoint array in a first configuration comprises selecting a reference row and a selected column, in which all crosspoint devices connected to the reference row have the same resistance state.

6. The method of claim 1, in which comparing the setup voltage and sense voltage comprises outputting the setup voltage and sense voltage to a comparator.

7. The method of claim 6, in which the comparator outputs a voltage pulse if the setup voltage and sense voltage are not equivalent.

8. The method of claim 6, further comprising:
   accepting an output of the comparator with an amplifier;
   setting a preset/reset value for the amplifier;
   generating a digital value in the amplifier by modifying the preset/reset value according to the output of the comparator; and
   outputting the digital value to a latch.

9. The method of claim 1, in which the configuration of the crosspoint memory array is switched from the first configuration to the second configuration during computation of the logical operation.

10. The method of claim 1, wherein comparing the setup and sense voltages is used to reduce an influence of half selected devices in the memory array on the logical operation.

11. The method of claim 1, wherein the setup voltage is used as a baseline measurement of resistance in half selected devices of the memory array during production of the sense voltage.

12. A method for implementing Boolean logic operations in a resistive nonvolatile crosspoint memory array comprising:
   selecting the logical Boolean operation by selecting a reference row and a column in the crosspoint memory array and inputting a preset/reset value to an amplifier in a sense circuit;
   applying an input voltage to the reference row to produce a setup voltage;
   storing the setup voltage in a storage element in the sense circuit;
   selecting data rows intersecting the selected column in the crosspoint memory array, in which crosspoint devices at the intersection of the selected data rows and the selected column store data values to be operated on by the Boolean logic operation;
   applying the input voltage to the selected data rows to produce a sense voltage;
   comparing the sense voltage to the setup voltage with a comparator;
   outputting a voltage pulse from the comparator if the sense voltage is different than the setup voltage;

if no voltage pulse if produced, then outputting from the amplifier, the preset/reset value to a latch; and if a voltage pulse is produced, then accepting, with the amplifier, the voltage pulse, modifying the preset/reset value, and then outputting the modified preset/reset value to the latch.

13. A system comprising:

a resistive nonvolatile memory array comprising at least one reference row and data rows; and a dynamic sense circuit comprising a dynamic sense amplifier and a data latch;

in which the resistive nonvolatile memory array and the dynamic sense circuit are configured to execute Boolean logic functions on data stored within the resistive nonvolatile memory array without the use of external logic gates.

14. The system of claim 13, in which the dynamic sense circuit directly accesses data in the resistive nonvolatile memory array during execution of the Boolean logic functions.

15. The system of claim 13, in which the resistive nonvolatile memory array comprises:

a first configuration in which a first reference row and a selected column produce a first voltage divider; and a second configuration in which at least one data row and the selected column produce a second voltage divider.

16. The system of claim 15, in which the dynamic sense amplifier comprises:

a storage element to store a setup voltage output by the first voltage divider;

a comparator to accept a sense voltage output by the second voltage divider and to compare the sense voltage to the setup voltage to produce a comparator output; and an amplifier to accept the comparator output and to modify a preset/reset value with the comparator output to produce a digital result of the Boolean logic function.

17. The system of claim 13, in which the at least one reference row comprises:

a first reference row connected to a plurality of crosspoint devices, in which each of the crosspoint devices comprise a high resistance state; and a second reference row connected to a plurality of crosspoint devices, in which each of the crosspoint devices comprise a low resistance state.

18. The method of claim 1, wherein the first configuration comprises creating a voltage divider within the crosspoint memory array by, with a particular column selected, applying a voltage to unselected rows of the crosspoint memory array and connecting a selected row of the crosspoint memory array to ground potential, and output of the voltage divider upon application of the input voltage being the setup voltage.

19. The method of claim 18, wherein producing the sense voltage further comprises, with the same selected column, selecting multiple data rows by connected the selected multiple data rows to ground potential, wherein, upon application of the input voltage, output of the resulting voltage divider being the sense voltage.

20. The method of claim 18, further comprising connecting the selected column to an amplifier, the output of the amplifier being input to a set-reset latch.

* * * * *